United States Patent
Zhang et al.

(10) Patent No.: US 9,780,332 B2
(45) Date of Patent: Oct. 3, 2017

(54) FLEXIBLE ELECTRONIC DEVICES

(71) Applicant: EverDisplay Optronics (Shanghai) Limited, Shanghai (CN)

(72) Inventors: QiGuo Zhang, Shanghai (CN); ChengPei Huang, Shanghai (CN); ChuWang Huang, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 15/228,151

(22) Filed: Aug. 4, 2016

(65) Prior Publication Data

US 2016/0343987 A1 Nov. 24, 2016

Related U.S. Application Data

(63) Continuation of application No. 14/152,732, filed on Jan. 10, 2014, now Pat. No. 9,429,998.

(30) Foreign Application Priority Data

Mar. 8, 2013 (CN) .......................... 2013 1 0073718

(51) Int. Cl.
*H01L 51/56* (2006.01)
*H01L 51/52* (2006.01)
*G06F 1/16* (2006.01)
*H01L 27/32* (2006.01)
*H01L 51/00* (2006.01)

(52) U.S. Cl.
CPC ........ *H01L 51/5253* (2013.01); *G06F 1/1652* (2013.01); *H01L 27/3244* (2013.01); *H01L 51/003* (2013.01); *H01L 51/56* (2013.01); *H01L 2227/323* (2013.01); *H01L 2227/326* (2013.01); *H01L 2251/301* (2013.01); *H01L 2251/5338* (2013.01); *H01L 2251/558* (2013.01); *Y10T 29/49155* (2015.01)

(58) Field of Classification Search
CPC ............. G02F 1/13318; G02F 1/13336; G02F 1/133605; G02F 1/133603; G02F 2203/09
See application file for complete search history.

(56) References Cited

U.S. PATENT DOCUMENTS

| 6,484,045 | B1 * | 11/2002 | Holker | ............... | A61B 5/14865 |
| | | | | | 204/403.01 |
| 9,429,998 | B2 * | 8/2016 | Zhang | .................. | G06F 1/1652 |
| 2010/0068483 | A1 * | 3/2010 | Leu | .......................... | B32B 7/06 |
| | | | | | 428/212 |

(Continued)

FOREIGN PATENT DOCUMENTS

| JP | 2006095783 | 4/2006 |
| JP | 2008-204850 | 9/2008 |

*Primary Examiner* — Donald Raleigh
(74) *Attorney, Agent, or Firm* — Andrew F. Young, Esq.; Lackenbach Siegel, LLP

(57) ABSTRACT

The present disclosure is related to display panels, especially to flexible electronic devices. By means of adding an inorganic membrane with surface roughness between a bonding layer and a PI film, in order to effectively improve the dimensional stability of plastic substrate and the water/oxygen barrier property of flexible substrate during the PI film fabrication and the follow-up process, improving the yield of good products and prolonging the working life thereof.

9 Claims, 2 Drawing Sheets

(56) References Cited

U.S. PATENT DOCUMENTS

| | | | |
|---|---|---|---|
| 2010/0143708 A1* | 6/2010 | Liao | B32B 17/10 |
| | | | 428/336 |
| 2012/0052214 A1* | 3/2012 | Tsai | G03F 7/2016 |
| | | | 427/558 |
| 2012/0082925 A1* | 4/2012 | Wang | G02B 5/201 |
| | | | 430/7 |
| 2012/0164408 A1* | 6/2012 | Hwu | B32B 7/06 |
| | | | 428/202 |
| 2012/0235315 A1* | 9/2012 | Wu | H01L 21/6835 |
| | | | 264/104 |
| 2013/0071650 A1* | 3/2013 | Liu | B32B 37/26 |
| | | | 428/333 |
| 2013/0072079 A1* | 3/2013 | Tang | G02F 1/133351 |
| | | | 445/24 |
| 2013/0077033 A1* | 3/2013 | Li | G02F 1/1333 |
| | | | 349/122 |
| 2014/0162522 A1* | 6/2014 | Zhou | G02F 1/133305 |
| | | | 445/24 |

* cited by examiner

FLEXIBLE ELECTRONIC DEVICES

CROSS-REFERENCE TO RELATED APPLICATIONS

The present application is a continuation application of application Ser. No. 14/152,732 filed on Jan. 10, 2014, and claims priority to and the benefit of Chinese Patent Application No. CN 201310073718.9, filed on Mar. 8, 2013, the entire content of each of which is incorporated herein by reference.

BACKGROUND OF THE INVENTION

1. Field of the Invention

The present disclosure relates to display devices, more specifically, to electronic devices.

2. Description of the Related Art

A flexible display device can display information even though it is folded or bent, by means of forming display thereof unit on a flexible substrate. Therefore, the flexible display device is with a vast application prospect in field of portable electronic devices, wherein, the display equipments adopting the flexible display device comprise: Cholesteric Liquid Crystal Display ("LCD", hereinafter), Electrophoresis Device and Organic Light-emitting Diode ("OLED", hereinafter) and so on.

OLED mainly consists of a cathode layer where electrons can be injected, and an anode layer where holes can be injected. A voltage of suitable polarity is applied between the cathode layer and the anode layer to combine the holes and the electrons to release energy by lighting, i.e., electrofluorescence. Thus, OLED is Self-Illumination, and consequently, the back-lighting is unnecessary. Therefore, a light, thin and flexible display can be achieved by OLED. In the related art, the OLED is combined with a flexible substrate and a TFT backplane to fabricate a flexible OLED device, where the flexible substrate technology and de-bonding technology is pivotal.

The flexible substrates applied in the flexible display devices mainly include: organic plastic substrate, such as PC, PET, PEN, PES, PI, composite material substrate made from organic material and inorganic material by means of laminating or other methods and metal substrate containing stainless steel or aluminum.

Presently, the usage of the flexible substrate mainly includes the following two methods, i.e., the pre-prepared sheet material is provided, then it is bonded to a rigid substrate, such as glass, by binder; and the organic polymer precursor, such as polyimide precursor, is coated on the hard substrate.

The flexible substrate is required to be with the excellent properties of surface topography, thermo stability, low thermal expansion coefficient and reliability. Particularly, along with the popularity of the smart phone, the smart phone is of more and more function. The screen is the mainly interactive interface with user. The high resolution and large size panel are extremely important. And, the requirement for the flexible electronic device is higher and higher.

In the fabrication of the flexible electronic device, presently, inorganic powder is doped into an inorganic material precursor with a purpose to obtain a coefficient of thermal expansion (CTE) of 20 ppm/° C. (SID2010, Jia-Ming Liu and so on, Invited Paper: High Performance Organic-Inorganic Hybrid Plastic Substrate for Flexible Display and Electronics), and to control and improve dimensional and thermal stability thereof. However, it is still different from the coefficient of thermal expansion of the rigid substrate, for example, the coefficient of thermal expansion of glass is 3.39 ppm/° C. Therefore, when fabricating the flexible electronic device, interlaminar stress will generates, leading to a warp in the substrate, and subsequently leading to stripping or cracking of membrane. Finally, various display defects will incur.

Meanwhile, permeability of the flexible substrate to oxygen or moisture is also important. For example, the organic light-emitting diode is easily affected by the oxygen or the moisture because the permeation of the oxygen or the moisture reduces the function and life of the organic light-emitting diode.

The de-bonding technology means a such technology where after a required electronic device is fabricated from a flexible substrate attached to a rigid substrate, such as glass, the flexible substrate and the rigid substrate are separated.

However, in the above de-bonding process, the amorphous silicon is applied as sacrificial layer and laser equipment is applied. Consequently, the cost of the product is high.

FIG. 1 is a structure diagram for de-bonding layer disclosed by ITRI in related art. As shown in FIG. 1, ITRI disclosed a technology for de-bonding layer (SID2010, Cheng-Chung Lee and so on, Invited Paper: A Novel Approach to Make Flexible Active Matrix Displays): successively, Layer 12 is stuck on Rigid Glass Substrate 11, wherein, Layer 12 has a suitable bonding ability; next, a solution of PI precursor is coated with a coating area bigger that de-bonding layer area; next, the PI solidifies to form PI Membrane 13; next, normal TFT process is actualized on PI Membrane 13 to form Device, such as TFT 14; finally, PI Membrane 13 is cut along with edges of DBL layer, Layer 12. The bonding ability of PI Membrane 13 to Layer 12 is weak, consequently, Layer 12 can be easily separated from the PI membrane after the cutting process.

The above-mentioned de-bonding technology is simplified. However. PI Membrane directly contacts to Rigid Substrate 11 at outer parts thereof, the generated cohesive force will lead to an inaccurate alignment in TFT process.

Furthermore, in the above-mentioned process, a gas barrier layer (containing $SiN_x$ and composite layer) is formed on PI Membrane to solve the problem of permeability. The gas barrier layer, in part, overcomes the permeability of water/oxygen of PI Membrane 13. However, there is still a difference of coefficient of thermal expansion, leading to an inaccurate alignment in the following TFT process because of stress. Particularly, when the technology is carried out on a bigger size glass substrate, bigger than that of G2 generation, the problem will be more serious. Therefore, the yield rate of product is decreased.

U.S. Patent No. 2008309867A1 has disclosed a fabrication of a thin-film flexible electronic device of the screen type that includes a plurality of thin-film components on a glass support a starting support is prepared, including a rigid bulk substrate and a glass sheet fastened to the rigid bulk substrate by reversible direct bonding so as to obtain a removable interface. The plurality of thin-film components are fabricated on the glass sheet. The glass sheet is separated from the rigid bulk substrate by disassembling the interface and, the glass sheet and the plurality of thin-film components are transferred to a final support.

Korea Patent No. 20040111403A has disclosed an organic luminescence device and its production method. An organic luminescence device uses a substrate with a gas-barrier film in which a gas-barrier film containing an amorphous oxide and at least two kinds of oxides selected from the group consisting of boron oxide, phosphorus oxide, sodium oxide, potassium oxide, lead oxide, titanium oxide, magnesium oxide, and barium oxide is formed on a substrate. The selected two kinds of oxides are a combination of an oxide of an element having a large atomic radius and an oxide of an element having a small atomic radius. The substrate is made of glass or plastic. As a result, the organic luminescence device using a substrate excellent in gas-barrier capability to prevent the infiltration of oxygen, water vapor and so on. from outside is provided. Consequently, it did not solve the problem of increasing the cost.

SUMMARY OF THE INVENTION

An embodiment of the present disclosure is directed toward a flexible electronic devices capable of effectively improve the dimensional stability of plastic substrate and the water/oxygen barrier property of flexible substrate during the PI film fabrication and the follow-up process, improving the yield rate of good products and prolonging the working life thereof.

A flexible electronic device, comprising:
(a) a substrate:
(b) a separating layer partly covering the substrate;
(c) an inorganic membrane, having a rough upper surface, covering side walls and an upper surface of the separating layer, and covering an exposed upper surface of the substrate;
(d) a display device substrate covering side walls and an upper surface of the inorganic membrane, and partly covering an exposed upper surface of the substrate;
(e) electronic components configured on surface of the display device substrate.

Preferably, the inorganic membrane is a membrane formed by means of Plasma Enhanced Chemical Vapor Deposition process.

Preferably, the inorganic membrane is a membrane which is quickly formed by means of Plasma Excitation Power, at a temperature lower than 200° C., with mixed gas including silane predominates.

Preferably, a thickness of the inorganic membrane is less than 300 nm.

Preferably, the material of the inorganic membrane is amorphous silicon or silicon nitride.

Preferably, adhesive force between the separating layer and the substrate is less than a preconfigured value.

Preferably, the separating layer is double side adhesive material.

Preferably, the roughness of the upper surface of the inorganic membrane is no less than Rz 0.2 μm and no more than Rz 0.3 μm.

Preferably, a material of the substrate is glass.

BRIEF DESCRIPTIONS OF THE DRAWINGS

The accompanying drawings, together with the specification, illustrate exemplary embodiments of the present disclosure, and, together with the description, serve to explain the principles of the present disclosure.

DESCRIPTIONS OF THE PREFERRED EMBODIMENTS

Hereinafter, certain exemplary embodiments according to the present disclosure will be described with reference to the accompanying drawings.

In this embodiment, first, a separating layer is formed on upper surface of a rigid substrate, such as glass, for example, a double sided adhesive material is stuck to the glass substrate as the separating layer in the follow-up process, where the separating layer partly covers the rigid substrate; next an inorganic membrane is deposited, for example, the inorganic membrane is amorphous silicon or silicon nitride membrane formed by means of Plasma Enhanced Chemical Vapor Deposition process, to cover the side walls and the upper surface of the separating layer, and the inorganic membrane also covers the exposed part of the upper surface of the rigid substrate; finally, a precursor of plastic substrate is coated to cover the side walls and the upper surface of the inorganic membrane, and partly cover the exposed part of the upper surface of the rigid substrate; after solidification, the plastic substrate forms a display device substrate, and electronic components are set up on surface of the display device substrate.

Preferably, the roughness of the upper surface of the inorganic membrane is more that or equal to Rz 0.2 μm and less than or equal to Rz 0.3 μm. Meanwhile, preferably, the adhesive force between the separating layer and the rigid substrate is less than a preconfigured value. The preconfigured value can be adhesive force of separating layer to the inorganic membrane. Alternatively, the preconfigured value can be the adhesive force of inorganic membrane to substrate of the display device.

Figure 1:
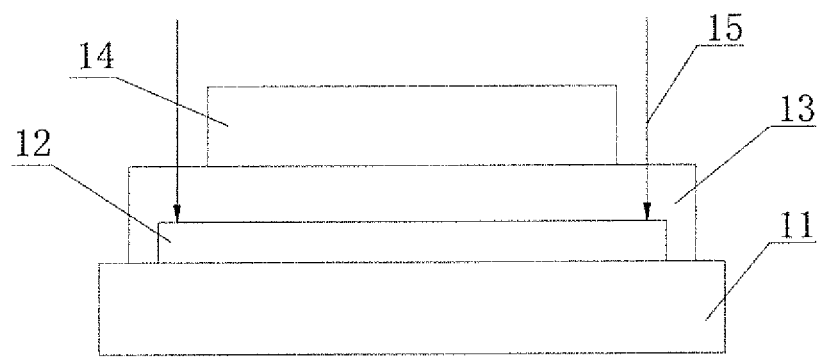
FIG. 1 shows structure diagram of the de-bonding layer technology disclosed by ITRI in the related art.
Figure 2:
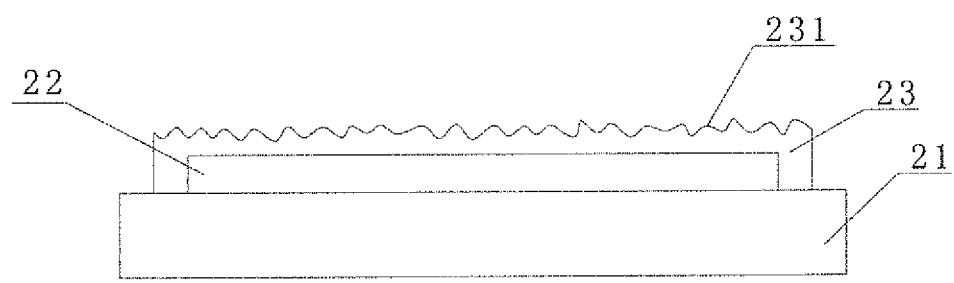
FIGS. 2 to 4 show a flow diagram of the formation of the flexible electronic device of the present disclosure.
Figure 3:
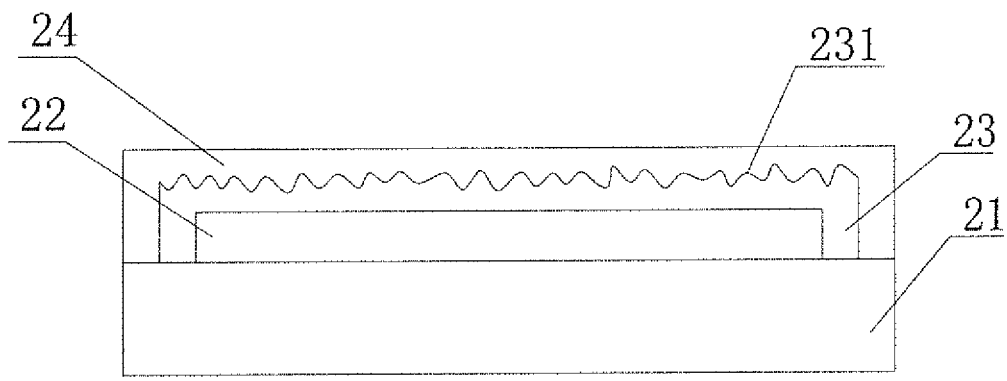
Figure 4:
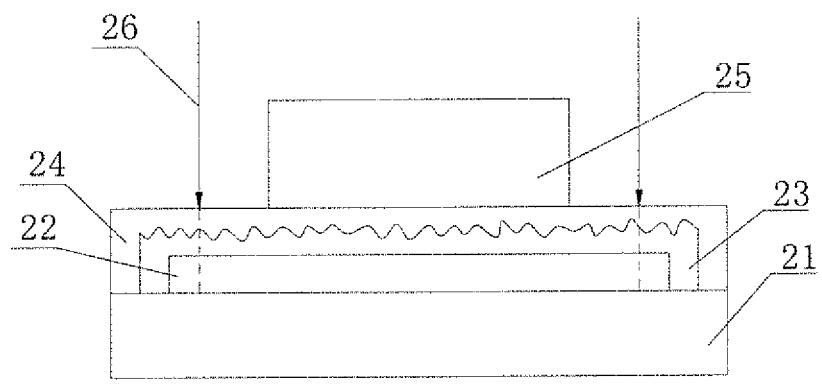

FIGS. 2 to 4 show a flow diagram of the formation of the flexible electronic device of the present disclosure. FIGS. 2 to 4 show that, first, Separating Layer 22 is formed on upper surface of Rigid Substrate 21 to partly cover Rigid Substrate 21. Rigid Substrate 21 can be, for example, glass substrate. Separating Layer 22 can be, for example, double sided adhesive material.

Next. Inorganic Membrane 23 is deposited to cover the side walls and the upper surface of Separating Layer 22. Inorganic Membrane 23 can be amorphous silicon, such as silicon hydride, or silicon nitride membrane formed by means of Plasma Enhanced Chemical Vapor Deposition process. Specifically, at the temperature lower than 200° C., such as 200° C. 190° C., 180° C., 170° C. 150° C., 120° C. and so on, Inorganic Membrane 23 is quickly formed on Separating Layer 21, by means of powder of Plasma Excitation with mixture gas where silane predominates. Inorganic Membrane 23 covers the side walls and the upper surface of Separating Layer 22, and also covers the exposed part of the upper surface of Rigid Substrate 21. In this embodiment, the thickness of Inorganic Membrane 23 can be less than 300 nm, such as 100 nm, 150 nm, 200 nm, 300 nm, and so on.

Preferably, Upper Surface 231 of Inorganic Membrane 23 is a rough surface, i.e., Upper Surface 231 has a roughness. Inorganic Membrane 23 effectively improves the dimensional stability of plastic substrate and the water/oxygen barrier property of flexible substrate during the PI film fabrication and the follow-up process, improving the yield rate of good products and prolonging the working life thereof, wherein, the roughness of Upper Surface 231 can be more that or equal Rz 0.2 μm and less that or equal to Rz 0.3 μm, such as Rz 0.2 μm, Rz 0.24 μm, Rz 0.26 μm, Rz 0.28 μm or Rz 0.3 μm and so on. The roughness of Upper Surface 231 is measured according to Ten Height Points of Microscopic Planeness.

Next, a precursor of plastic substrate, such as PI solution, is coated to cover the side walls and Upper Surface 231 of the Inorganic Membrane 23, and partly cover the exposed part of the upper surface of the Rigid Substrate 21; after solidification process, the plastic substrate forms Display Device Substrate 24.

Finally, Electronic Component 25, such as TFT, where Electronic Component 25 is not limited by TFT, is set up on surface of Display Device Substrate 24. After fabricating Electronic Component 25, Display Device Substrate 24 is cut along with inner edge of Separating Layer 22, for example, the position expressed by Arrow 26. The adhesive force between Separating Layer 22 and Rigid Substrate 21 is not strong, therefore the fabricated electronic device, including remaining display device substrate, remaining inorganic membrane and remaining separating layer, after cutting, can be easily de-bonded form Rigid Substrate 21, to complete the fabrication of a display device with a display substrate and an inorganic membrane.

In this embodiment, preferably, the adhesive force between Separating Layer 22 and Rigid Substrate 21 is less than a preconfigured value. The preconfigured value can be adhesive force of Separating Layer 22 to Inorganic Membrane 23; or the preconfigured value can be adhesive force of Inorganic Membrane 23 to Display Device Substrate 24, to ensure the follow-up de-bonding process running smoothly, in the case that the adhesive force of Separating Layer 22 to Rigid Substrate 21 can meet the requirement of carrying out follow-up process, where after the cutting process, a separating process of remaining separating layer form Rigid Substrate 21.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flexible electronic device, comprising:
   (a) a substrate;
   (b) a separating layer partly covering the substrate;
   (c) an inorganic membrane, having a rough upper surface, covering side walls and an upper surface of the separating layer, and covering an exposed upper surface of the substrate;
   (d) a display device substrate covering side walls and an upper surface of the inorganic membrane, and partly covering an exposed upper surface of the substrate;
   (e) electronic components configured on surface of the display device substrate.

2. The flexible electronic device as disclosed in claim 1, wherein the inorganic membrane is a membrane formed by means of Plasma Enhanced Chemical Vapor Deposition process.

3. The flexible electronic device as disclosed in claim 1, wherein the inorganic membrane is a membrane which is quickly formed by means of Plasma Excitation Power, at a temperature lower than 200° C., with mixed gas including silane predominates.

4. The flexible electronic device as disclosed in claim 1, wherein a thickness of the inorganic membrane is less than 300 nm.

5. The flexible electronic device as disclosed in claim 1, wherein the material of the inorganic membrane is amorphous silicon or silicon nitride.

6. The flexible electronic device as disclosed in claim 1, wherein adhesive force between the separating layer and the substrate is less than a preconfigured value.

7. A flexible electronic device as disclosed in claim 1, wherein the separating layer is double side adhesive material.

8. The flexible electronic device as disclosed in claim 1, wherein the roughness of the upper surface of the inorganic membrane is no less than Rz 0.2 μm and no more than Rz 0.3 μm.

9. The flexible electronic device as disclosed in claim 1, wherein a material of the substrate is glass.

* * * * *